(12) United States Patent
Kinoshita (10) Patent No.: US 6,327,413 B1
(45) Date of Patent: Dec. 4, 2001

(54) OPTOELECTRONIC DEVICE AND LASER DIODE

(75) Inventor: Junichi Kinoshita, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/238,493

(22) Filed: Jan. 27, 1999

(30) Foreign Application Priority Data

Feb. 2, 1998 (JP) .................................................. 10-021266

(51) Int. Cl.$^7$ ...................................................... G02B 6/04
(52) U.S. Cl. ............................ 385/129; 385/14; 385/31; 385/37; 385/130; 385/131
(58) Field of Search ................................... 385/129–132, 385/31, 37, 14; 372/45, 46

(56) References Cited

U.S. PATENT DOCUMENTS

| | | | |
|---|---|---|---|
| 4,900,127 | * 2/1990 | Robello et al. | 385/131 X |
| 5,007,694 | * 4/1991 | Yamamoto et al. | 385/14 X |
| 5,070,509 | * 12/1991 | Meyers | 372/45 |
| 5,650,640 | * 7/1997 | Stafford et al. | 257/81 |
| 5,887,116 | * 3/1999 | Grote | 385/2 |
| 5,892,859 | * 4/1999 | Grote | 385/2 |

\* cited by examiner

*Primary Examiner*—Brian Healy
(74) *Attorney, Agent, or Firm*—Hogan & Hartson, L.L.P.

(57) ABSTRACT

Both an electric energy applying mechanism and an optical waveguide mechanism can be provided to an ITO layer (transparent electrode) by constituting an optical waveguide so as that the guided mode profile spread into the ITO layer. Also a bonding pad is provided to supply a power and apply an electric field onto the ITO layer. Accordingly, a device structure can be simplified and thus improvement in yield of the optoelectronic device having an optical waveguide and improvement in parameters of the optoelectronic device can be achieved.

25 Claims, 6 Drawing Sheets

OPTOELECTRONIC DEVICE AND LASER DIODE

BACKGROUND OF THE INVENTION

1. Field of the Invention

The present invention relates to optoelectronic devices which include electrodes and optical waveguides as essential constituent elements and, more particularly, to an electrode structure of laser diodes and their application technology.

2. Description of Related Art

Figure 6:
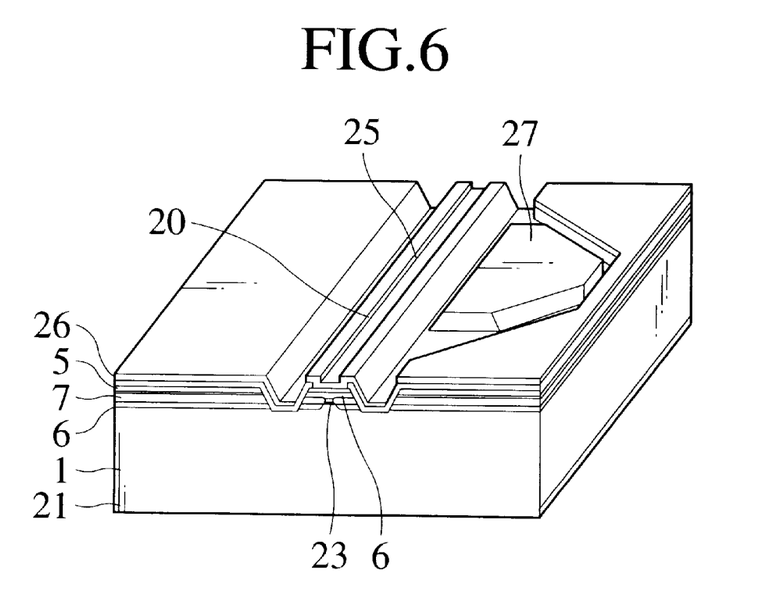
FIG. 6 is a schematic perspective view showing an example of a mesa electrode structure.

There is a DFB (distributed feedback) laser as one type of laser diodes. This laser diode has a diffraction grating in which a refractive index is changed periodically along the waveguide. The laser diode can oscillate in a single longitudinal mode (SLM) (i.e., one oscillation line) around the Bragg wavelength determined by the period of the diffraction grating. For 6. In this mesa electrode structure, in order to reduce a junction area, the p-side electrode 20 must be formed on the top of a mesa stripe 25 surrounding the active layer and also must be connected to a bonding pad 27 on the thick SiO2 film 26, while taking account of step-recoverage.

As described above, in the laser diode in the related art, several stages of the epitaxial crystal growth by the MOCVD (Metal Organic Chemical Vapor Deposition) technique must be needed (growing steps (1) to (4) in the above related art), and also step-recovering processes, etc. must be needed to form the electrode.

Like the above, in the laser diode having an optical waveguide structure according to the related art, a number of manufacturing steps are needed since the device requires a complicated structure. Especially, there are problems such that its yield becomes lower and its cost increases higher because a plurality of delicate manufacturing procedures like the epitaxial crystal growth have reliability problems at regrowth interfaces. In addition, in the device structure in the related art, restrictions are imposed upon design of the optical waveguide and the electrode, and therefore it is difficult to improve the performance of the device according to the related art.

SUMMARY OF THE INVENTION

It is an object of the present invention to provide an optoelectronic device, and laser diode device, which are able to achieve improvement in yield of the optoelectronic device, which has an optical waveguide and improvement in parameters by simplifying a device structure.

As a preferred embodiment, an optoelectronic device that comprises an optical waveguide structure and electrodes, and the optical waveguide contained in the optical waveguide structure and at least a part of the electrode is formed of common material.

As described above, since the electrode structure and the optical waveguide mechanism are formed in common, the device can be simplified in configuration rather than the device structure in the related art. Accordingly, since the number of manufacturing steps can be reduced, especially steps of troublesome complicated epitaxial crystal growth, etc. can be reduced, yield of the device can be greatly improved and thus cost of the device can be effectively reduced.

In the related art, the waveguide performance is affected only by crystal properties and the electrode performance only by metal properties respectively. However, margin in design of the optical waveguide and the electrode can be enhanced if the transparent electrode and the optical waveguide are formed in common like the present invention, so that improvement in the performances can be achieved further.

The transparent electrode can be formed directly on the corrugated surface of an optical waveguide layer, and play a part of waveguiding role. Also, it becomes easier to produce grating function by making the distribution of refractive index, waveguide loss, or conductivity in the transparent electrode to be periodic along a waveguide direction of the optical waveguide. Also, the distribution of refractive index, waveguide loss, or conductivity in the transparent electrode or periodicity of the diffraction grating is set to produce Bragg diffraction of second order or more relative to the guided light. Also, there is provided dielectric substances or semiconductors, which are formed under the transparent electrode to be aligned periodically along a direction of the optical waveguide and has refractive index, optical loss, or gain being different from the transparent electrode. Also, underlying material of the transparent electrode is formed of material of an upper cladding layer or an optical waveguide layer of a laser diode. Also, a shape of the impurity layer or the metal layer between the transparent electrode and the underlying waveguide material is formed differently along an axis direction or a lateral direction. Also, an area of the transparent electrode is covered with opaque electrode except for a window area from which an optical output is emitted. Also, another change in optical properties can be controlled to giving a phase shifting effect to the original periodic structure. As a result, the DFB laser can be realized at simple steps rather than the device structure in the related art.

In the event that the periodical structure of refractive index is formed in the transparent electrode in itself, the expensive semiconductor wafer can be reused by re-forming the transparent electrode portion. Also, crystal properties are damaged if the dry etching is applied to the semiconductor crystal, nevertheless the transparent electrode is less damaged by the dry etching because it is not formed of a single crystal. Further, such periodical structure of refractive index formed in the transparent electrode is suited for mass production.

As a preferred embodiment, the transparent electrode are formed of ITO (Indium Tin Oxide), the refractive index of the ITO is controlled by an amount of oxygen contained in the ITO, and conductivity and insulating characteristic of the ITO is controlled by composition of tin contained in the ITO. Therefore, optical parameters of the transparent electrode such as refractive index can be controlled by using such material, method, etc. set forth in the invention. In addition, the control range of the transparent electrode can be set wider than the semiconductor crystal to thus allow larger margin in electrode design.

As a preferred embodiment, if the transparent electrode is employed in combination with insulating material or absorbing material, a gain/loss coupling DFB laser can be fabricated more easily.

Also, the distribution of refractive index, waveguide loss, or periodicity of the diffraction grating is set to produce Bragg scattering of second order or more relative to a waveguide light. Also, an area of the transparent electrode except for a window area from which an optical output is emitted is covered with opaque electrode according to the related art. Therefore, if the transparent electrode is applied to GCSEL employing a second-order diffraction grating, the output can be emitted more effectively because the transparent electrode can perform a role as a window for surface radiation output.

The optical properties include refractive index, waveguide loss, or conductivity. And also, the optical properties include structural properties such as thickness of waveguide or width thereof. Furthermore, the optical properties include the change in period of periodical structure, gain of underlying layer, non-linear optical coefficient when the waveguide is formed of LiNbO3.

If a sectional shape of the optical waveguide is set to a semicircle or a semiellipse, this area can function as a cylindrical lens. Therefore, a wider beam divergence angle of the radiation mode output in a direction along the waveguide width can be narrowed.

If the device may be constructed such that another change in the refractive index of the transparent electrode provides an effective phase shift to the underlying periodic structure, the phase shift can be realized by adjusting only the electrode.

The DFB lasers can be arranged in an array fashion such that they can oscillate at different wavelengths as a WDM (wavelength division multiplex) light source. In other words, a WDM integrated DFB laser array can be obtained only by working the electrode, while using the semiconductor portion including the active layer in common.

In addition, if the distribution of refractive index in the transparent electrode is set larger in a center axis area of the optical waveguide in section than other areas of the optical waveguide, the transparent electrode may be applied to normal transverse mode control waveguides in addition to the DFB laser.

BRIEF DESCRIPTION OF THE DRAWINGS

The objects, features and advantages of the present invention will become more apparent from the following description of the preferred embodiments taken in conjunction with the accompanying drawings, in which.

DETAILED DESCRIPTION OF THE EMBODIMENTS

Various embodiments of the present invention will be described with reference to the accompanying drawings. It is to be noted that same or similar reference numerals are applied to the same or similar parts and elements throughout the drawings, and the description of the same or similar parts and elements will be omitted or simplified.

Embodiments in which optoelectronic devices according to the present invention are applied to a laser diode, etc. will be explained hereinafter.

Embodiment 1

Figure 7A:
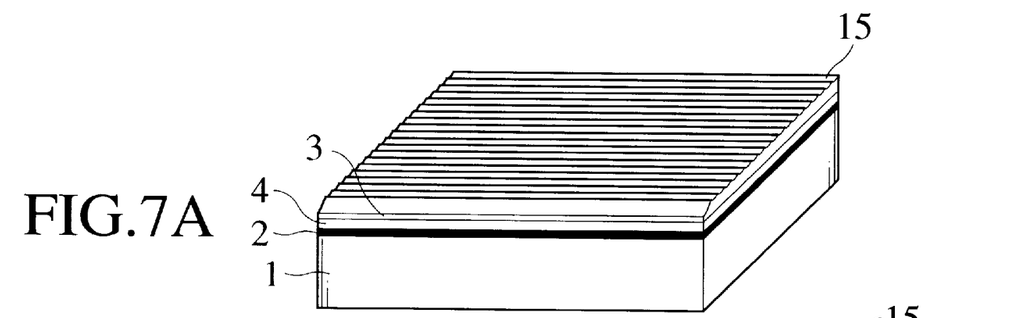
FIGS. 7A and 7B are schematic perspective views showing a structure of a laser diode according to a first embodiment of the present invention.

FIGS. 7A and 7B are schematic perspective views showing a structure of a laser diode according to a first embodiment of the present invention respectively. To begin with, as shown in FIG. 7A, an n-InP substrate 1 (including an n-InP buffer layer 1a), an MQW active layer 2, a p-InP layer 4, and a p-InGaAsP waveguide layer 3 are grown in sequence. Differences from the related art in FIG. 1 reside in that the p-InP layer 4 of 0.3 $\mu$m (preferably 0.05 $\mu$m to 0.7 $\mu$m, and more preferably 0.1 $\mu$m to 0.5 $\mu$m) thickness is grown on the MQW active layer 2 to constitute a double-hetero structure and then the waveguide layer 3 of 0.2 $\mu$m (preferably 0.02 $\mu$m to 0.5 $\mu$m, and more preferably 0.05 $\mu$m to 0.3 $\mu$m) thickness is grown on the p-InP layer 4. The crystal growth must be effected only once at this time.

Figure 7B:
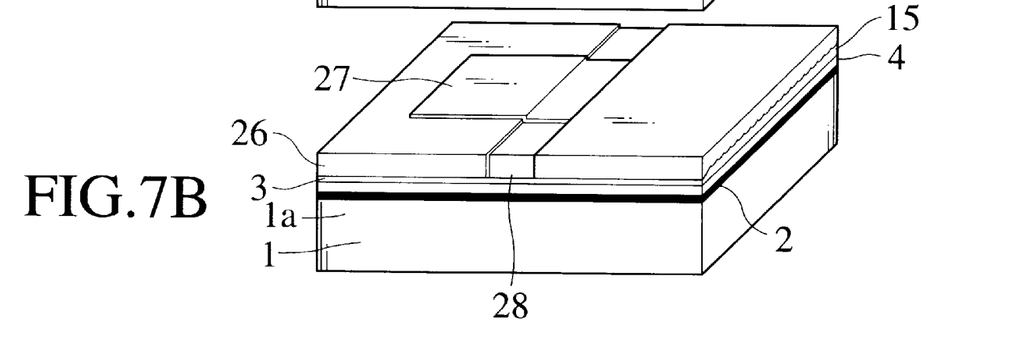

Then, a diffraction grating 15 is formed thereon. A number of steps are prepared after this step in the related art. But, in this example, as shown in FIG. 7B, only an SiO2 film (oxide film) 26 having a refractive index of 1.5 is stacked on the diffraction grating 15 to have a thickness of 0.5 $\mu$m (preferably 0.05 $\mu$m to 1.0 $\mu$m, and more preferably 0.1 $\mu$m to 0.5 $\mu$m).

Then, resist is coated thick and then the SiO2 film 26 is removed like a stripe. After this, an ITO (Indium Tin Oxide) layer 28 serving as a transparent electrode is stacked by the sputtering method and then the ITO layer 28 is left on the stripe-like area, from which the SiO2 film 26 is removed, by the lift-off method. A refractive index of the ITO layer 28 is controlled by an oxygen-containing amount. In the first embodiment, the refractive index of the ITO layer 28 is set to 3.0 (preferably 3.0 to 3.2, and more preferably 2.5 to 3.2). A refractive index of InP and InGaAsP (the active layer 2 and the waveguide layer 3) is equal to 3.2 and 3.4 for the lasing wavelength, respectively.

A waveguide mechanism constructed by the waveguide layer 3 and its underlying layers in the lateral direction can act as a gain guide. In other words, the waveguide structure is defined by a current injection area. In this waveguide mechanism, the guide light is spatially unstable because the gain region varies depending on a current level. However, a mechanism as an index guide can act between the ITO layer 28 and the SiO2 film 26 in the lateral direction. In other words, the ITO layer can function as a ridge waveguide. Transverse mode stability can be maintained based on balance of both mechanisms of the gain guide and the refractive index guide. In this case, if the MQW active layer 2 has a lower refractive index than the ITO layer 28 as the transparent electrode, light can not be guided. For this reason, in the first embodiment, the refractive index of the ITO layer 28 is set to 3.0 which is smaller than the active layer. A wire (not shown) to be connected to external electrode is bonded onto bonding pads 27 respectively.

Figure 1:
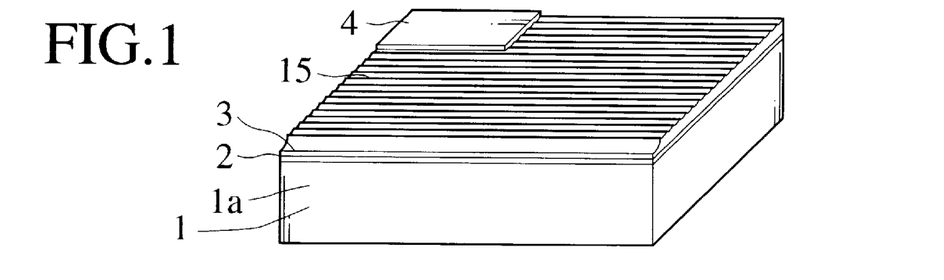
FIGS. 1 to 4 are schematic perspective views showing a part of steps of manufacturing an InGaAsP/InP DFB laser in the related art.
Figure 2:
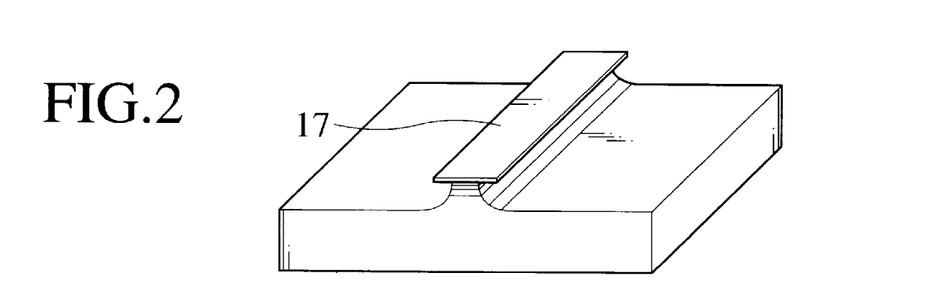
Figure 3:
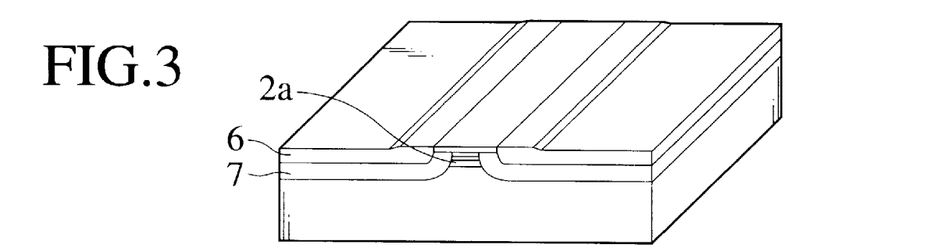
Figure 4:
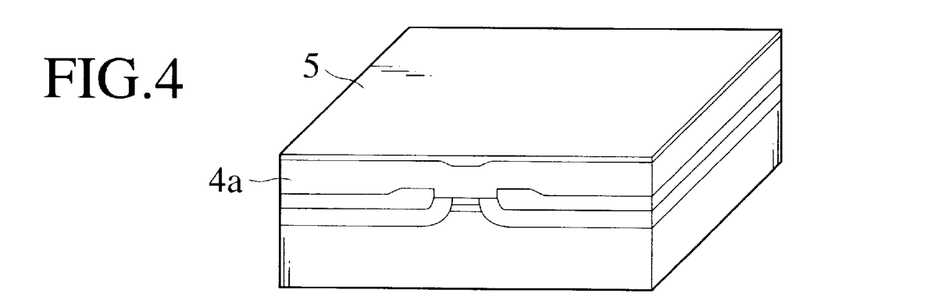
Figure 5:
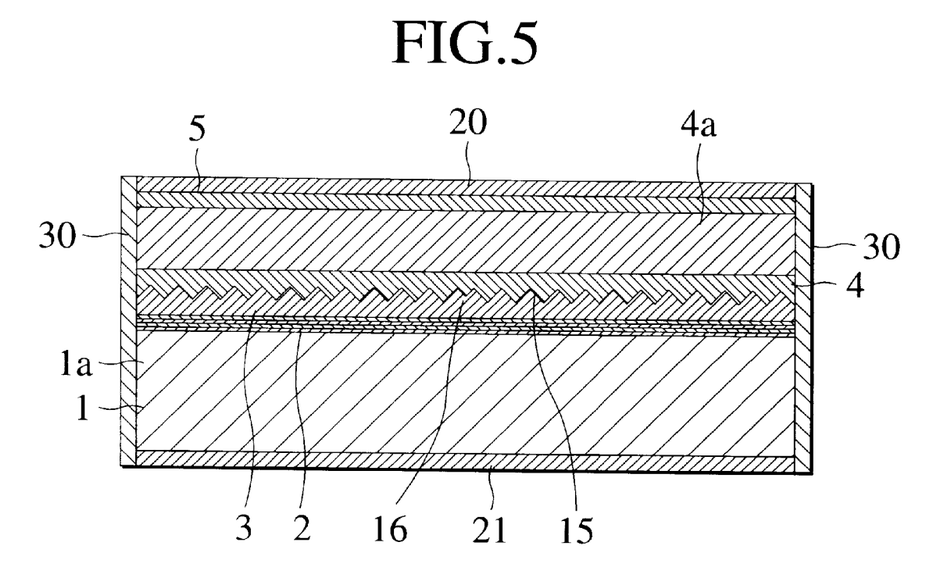
FIG. 5 is a schematic sectional view showing an optoelectronic device, which is manufactured by the steps of manufacturing the DFB laser in the related art.

As a result, in contrast to the related art, which has been described in FIG. 1, the DFB laser can be realized by considerably simple steps.

Embodiment 2

The DFB laser is constructed by using the diffraction grating formed on the semiconductor in the first embodiment and the related art, but transparent electrode itself can also be designed to perform a function of the diffraction grating. In this case, since there is no need of forming the diffraction grating on the epitaxially grown semiconductor, manufacture of the device becomes much easier. In particular, if a selective etching process only for transparent electrode material is employed to remove the electrode, manufacturing steps subsequent to the transparent electrode can be tried again without loss of the expensive semiconductor layer structure just in case of troubles. In addition, since, unlike the epitaxial growth, there is no necessity of matching the lattice constant to the semiconductor substrate, margin in design such as control of the refractive index, insertion of an insulating film, etc. can be increased. Further, the device can be free from the masstransport phenomenon which makes the diffraction gratings flat during crystal growth at the high temperature.

As described above, if the transparent electrode has the distribution of refractive index, the transparent electrode has various optical functions as well as the waveguide. More particularly, the refractive index of the transparent electrode can be varied by controlling composition of the ITO layer, i.e., a contained amount of oxygen, doping various impurities, etc. An embodiment wherein a function of the diffraction grating is provided to the transparent electrode will be explained hereinbelow.

Figure 8:
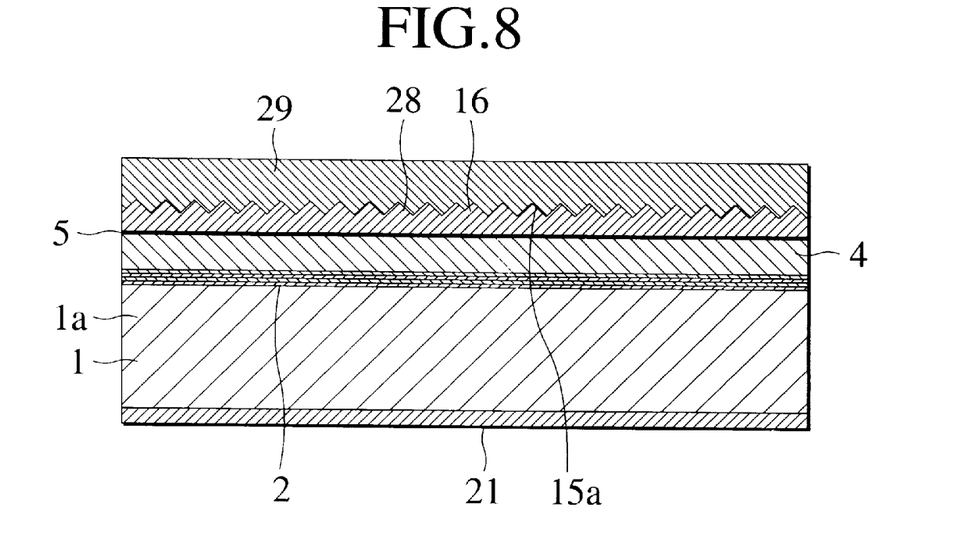
FIG. 8 is a schematic sectional view showing a structure of a laser diode according to a second embodiment of the present invention.

FIG. 8 is a schematic sectional view showing a structure of a laser diode according to a second embodiment of the present invention. First, the MQW active layer 2, the p-InP layer 4, and the very thin (preferably 0.005 $\mu$m to 0.05 $\mu$m, and more preferably 0.005 $\mu$m to 0.01 $\mu$m in thickness) p-InGaAsP contact layer 5 are grown on the n-InP substrate 1 (including the n-InP buffer layer 1a). Then, the ITO layer 28 (preferably 0.5 $\mu$m to 1.0 $\mu$m, and more preferably 0.5 $\mu$m to 0.6 $\mu$m in thickness) as the transparent electrode which has the refractive index 3.2 is stacked on a resultant structure by the sputtering method. Then, like the diffraction grating in the related art, a diffraction grating 15a (preferably 0.1 $\mu$m to 0.2 $\mu$m in depth) is formed on the ITO layer 28. Then, the ITO layer 29 (preferably 0.2 $\mu$m to 0.4 $\mu$m in thickness) having the refractive index 2.5 (preferably 2.5 to 2.8) is deposited thereon by the sputtering method. As a result, a waveguide mode spreading out from the active layer to the ITO layers 28, 29 reach the periodic structure of the diffraction grating 15a formed of the transparent electrode, whereby a distributed feedback (DFB) laser can be implemented.

The periodical structure of conductivity or optical loss in the transparent electrode can be formed by changing composition of tin (Sn) contained in the ITO layers 28, 29. This is the DFB laser into which a loss/gain coupling effect is added.

If periodicity of the diffraction grating 15a in the second embodiment is set as second order relative to the guided light, an optical output can be emitted perpendicularly to the waveguide direction, i.e., normal to a surface of the substrate. This is because, as a radiation mode, the first-order diffraction light is emitted from the diffraction grating 15a normal to the substrate. This structure has been known as a GCSEL (Grating Coupled Surface Emitting Laser Diode). In the GCSEL, the optical output is in general radiated from the overall resonator to have a certain distribution. If the optical output is required to be taken out only from a narrow area in which radiation mode lights are concentrated, the other areas of the transparent electrode other may be covered with a metal, etc. which can absorb and reflect the light.

Embodiment 3

An embodiment in which the present invention is not applied to control of the longitudinal mode in the DFB laser but to control of the transverse mode will be explained hereinbelow.

Figure 9:
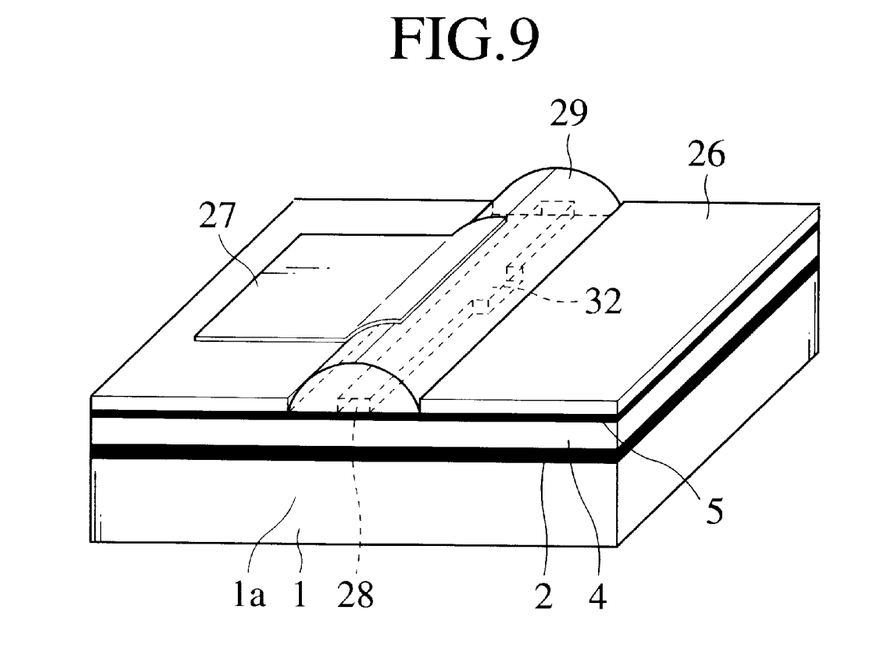
FIG. 9 is a schematic perspective view showing a structure of a laser diode according to a third embodiment of the present invention.

FIG. 9 is a schematic perspective view showing a structure of a laser diode according to a third embodiment of the present invention. The underlying semiconductor layers are formed in the same way as above embodiments. In other words, the MQW active layer 2, the p-InP layer 4, and the p-InGaAsP contact layer 5 are grown on the n-InP substrate 1 (including the n-InP buffer layer 1a). The ITO layer 28 acting as the transparent electrode is stacked and then patterned like a stripe. The refractive index of the ITO layer 28 is adjusted to 3.0.

Then, the ITO layer 29 (preferably 1.5 $\mu$m to 2.0 $\mu$m in thickness) which has the refractive index (n=2.5) (preferably 2.5 to 2.8) smaller than the refractive index ITO layer 28 is stacked thereon. Then, the ITO layer 29 is patterned like a stripe to bury the ITO layer 28 formed previously. An outer sectional shape of the ITO layer 29 is worked to a semicircle to be consistent with a profile of the transverse mode of the optical waveguide. Then, a peripheral area is insulated by an SiO2 film 26 and then a bonding pad 27 is formed, whereby the device can be finished.

Like this, if the ITO layer 29 is formed like a semicircle such that the distribution of the outer ITO layer 29 is enhanced around a center axis of the optical waveguide in section, the transverse mode can be stabilized.

When applied to the GCSEL, the cylindrical lens makes the radiation mode output beam divergence narrower in the width direction. The sectional shape of the ITO layer 29 may be set to not only the semicircle but also a semiellipse. In this case, a square sectional shape can be easily fabricated.

Embodiment 4

Although the transparent electrode employed in a series of embodiments is current conductive in itself, application fields of the optoelectronic device can be widened by incorporating the transparent electrode with the insulating dielectric substance having the refractive index at the same level as the transparent electrode.

Figure 10:
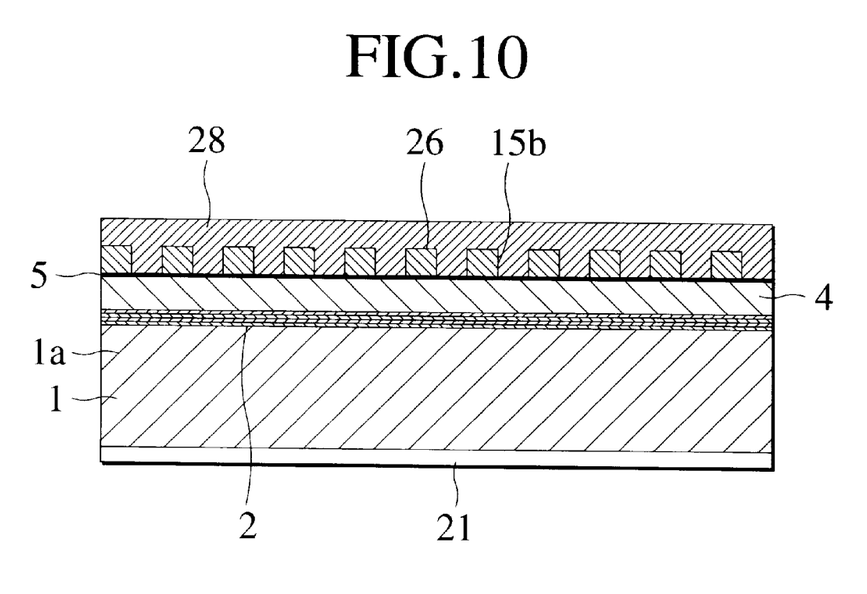
FIG. 10 is a schematic sectional view showing a structure of a laser diode according to a fourth embodiment of the present invention.

FIG. 10 is a schematic sectional view showing a structure of a laser diode according to a fourth embodiment of the present invention. The underlying semiconductor layers are formed in the same way as above embodiments. In other words, the MQW active layer 2, the p-InP layer 4, and the p-InGaAsP contact layer 5 are grown on the n-InP substrate 1 (including the n-InP buffer layer 1a). Then, the SiO2 film 26 as the insulating dielectric substance is deposited (preferably 0.1 $\mu$m to 0.2 $\mu$m), then is removed periodically along the axial direction to form the diffraction grating 15b such that the DFB operation can be achieved. Then, the ITO layer 28 acting as the transparent electrode is deposited stacked on an overall surface (preferably 0.5 $\mu$m to 1.0 $\mu$m).

A current can be blocked periodically by the SiO2 film 26 and accordingly a gain of the active layer can be changed periodically. As a result, the gain/loss coupling DFB laser can be realized.

Although the refractive index of the SiO2 film 26 is about 1.5, the refractive index can be increased up to about 2.2 if SiN is employed in place of the SiO2 film 26. The refractive index of the ITO layer 28 is also adjusted to about 2.2. Thus, the waveguide mode is not affected by the periodical structure of the refractive index. For this reason, the pure gain/loss coupled DFB operation can be achieved. Under the condition of such pure gain/loss coupling, the longitudinal mode, which oscillates at the Bragg wavelength and has a low threshold value, can be obtained.

In place of the film made of the insulating dielectric substance, semi-insulating semiconductor layer may also be employed. In this case, since the crystal growth layer must be proceed, care must be taken not to damage the underlying semiconductor layers.

Embodiment 5

As an embodiment resemble to the fourth embodiment, an optoelectronic device integrating the DFB laser and an EA modulator will be explained hereinbelow.

Figure 11:
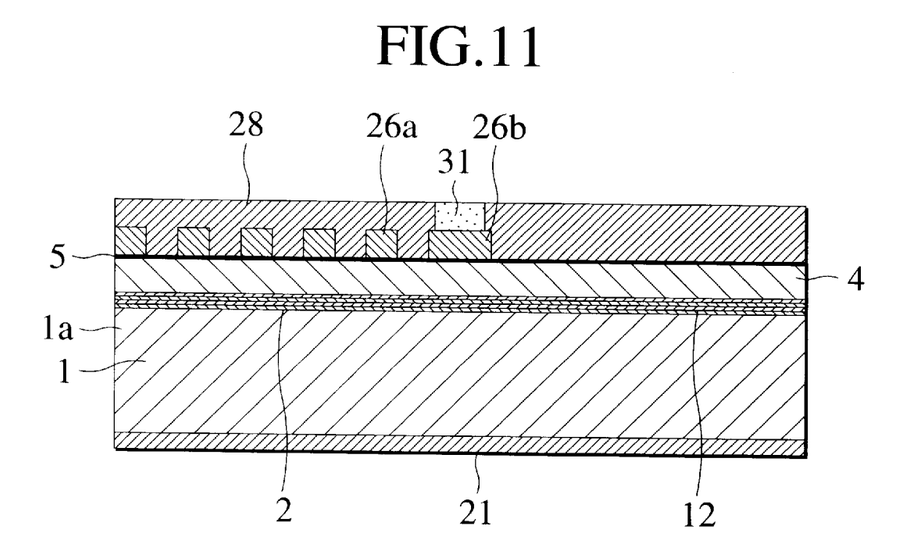
FIG. 11 is a schematic sectional view showing a structure of an optoelectronic device, in which a DFB laser and an EA modulator are integrated, according to a fifth embodiment of the present invention.

FIG. 11 is a schematic sectional view showing a structure of an optoelectronic device, in which the DFB laser and the EA modulator are integrated according to a fifth embodiment of the present invention. A structure of the underlying semiconductor layers has two types of waveguides, unlike the device in the above embodiments. One is the active layer 2 of the DFB laser and the other is an absorption layer 12 of an EA (Electro-Absorption type) modulator. In the DFB laser and the EA modulator, if the reverse bias level applied to the absorption layer 2a of the EA modulator is changed while the active layer 2 of the DFB laser which is DC operated, an absorption coefficient factor of the absorption layer 12 can be modulated. Therefore, the output light can be modulated by turning the applied voltage to the absorption layer 2a ON/OFF.

When such different devices are integrated monolithically, two types of devices must be manufactured such that they can be modulated independently. In particular, in the fifth embodiment, since the DFB laser is DC-driven by the forward bias current but the modulator is modulated according to the high-speed pulse modulation of the electric field generated by the reverse bias, both devices must be electrically isolated perfectly.

Then, the SiO2 film 26 as the insulating film is,stacked on the semiconductor wafer in this structure (preferably 0.1 μm to 0.2 μm). In this fifth embodiment, a diffraction grating 26a and an electrode separating pattern 26b are remained. The ITO layer 28 acting as two independent transparent electrodes is patterned to be separated on the electrode separating pattern 26b as the border. More particularly, the ITO layer 28 is formed on an entire surface and then the area of the ITO layer 28 just on the electrode separating pattern 26b is removed, or else an insulating dielectric substance film 31 having the same refractive index as the ITO is filled in the electrode separating pattern 26b after the ITO layer 28 has been removed in compliance with the pattern.

According to such structure, the waveguide light transferred from the active layer 2 of the DFB laser to the absorption layer 2a of the EA modulator is not affected by the variation in refractive index. In this case, since the guided light propagates without any change in transverse mode profile, the modal power loss scattered at the border of the two devices is minimized.

In addition, if shapes of the ITO layer 28 and the electrode separating pattern 26b are formed like a taper, the transverse mode profile can be transformed smoothly.

Embodiment 6

Figure 12:
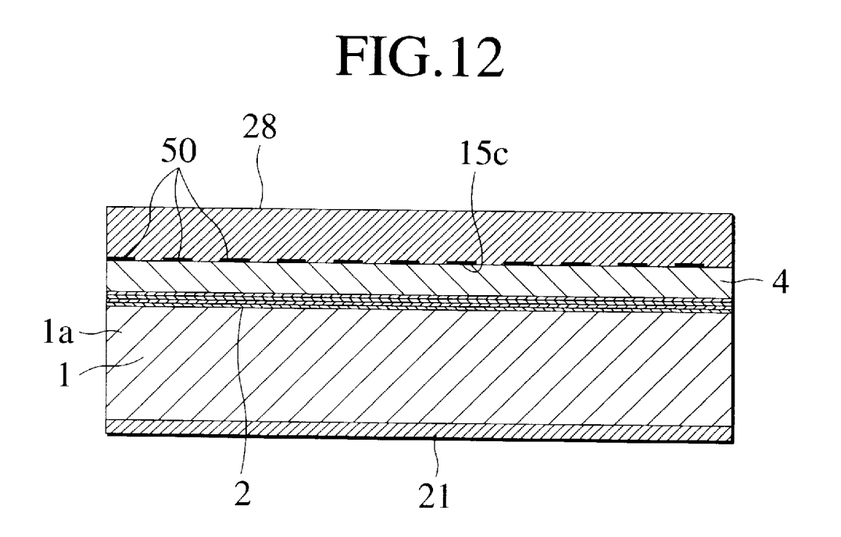
FIG. 12 is a schematic sectional view showing a structure of a laser diode according to a sixth embodiment of the present invention.

FIG. 12 is a schematic sectional view showing a structure of a laser diode according to a sixth embodiment of the present invention.

In general, even if the ITO layer is deposited directly on the semiconductor, ohmic contact between them cannot always be obtained. However, as shown in FIG. 12, if a very thin metal layer 50 (or impurity, etc.) which does not have an effect so much on the refractive index is flashed to be adhered onto a surface of the semiconductor, sufficient ohmic contact can be obtained. If the periodical structure consisting of this flashed metal layer is provided along the axial direction like a diffraction grating, the DFB action can be given to the flashed metal layer. In this case, optical loss caused by absorption or perturbation of current injection occurs and thus a rate of gain/loss coupling can be enhanced. In the sixth embodiment, an alloy layer of gold and zinc is stacked to have a thickness of 5 nm (preferably 3 nm to 10 nm, and more preferably 4 nm to 6 nm).

The meaning of "metal layer" includes layer of Ni, Cr, Ti, Pt, Al, etc. And the meaning of "impurity" includes Zn, Be etc.

Embodiment 7

Figure 13:
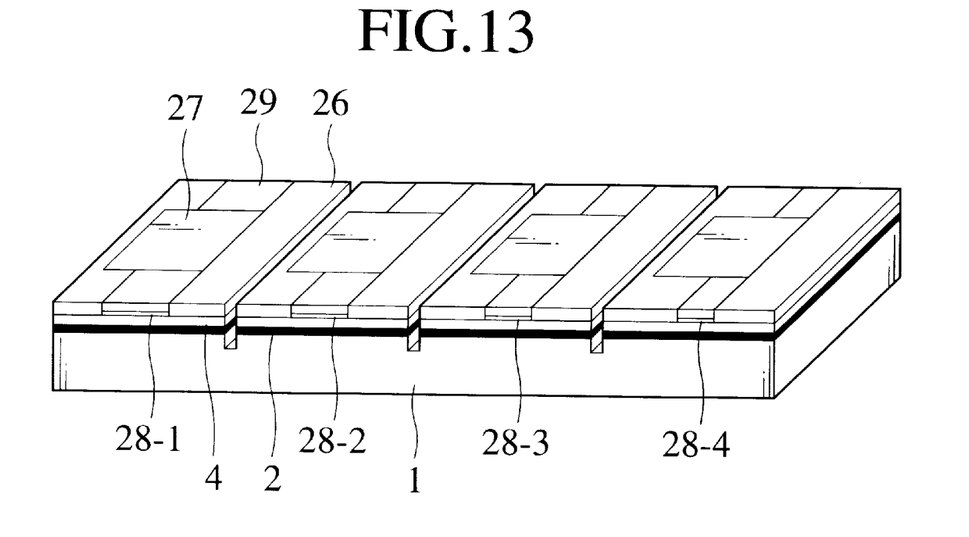
FIG. 13 is a schematic perspective view showing a structure of a laser diode according to a seventh embodiment of the present invention.

FIG. 13 is a schematic perspective view showing a structure of a laser diode according to a seventh embodiment of the present invention.

In the related art, the integrated device in which similar devices are arranged monolithically in an array fashion has been known. For example, there is a light source for the WDM (Wavelength Division Multiplexing) system optical communication. In an application example in the seventh embodiment, the DFB lasers having different oscillation wavelengths respectively are arranged at a certain interval in an array fashion such that respective wavelengths constitute channels.

In order to change the oscillating wavelengths of respective lasers, periodicity of the diffraction grating may be changed in respective devices or effective refractive indices may be changed. As with this respect, in the case of the related art in which the transparent electrode is not formed as a part of the optical waveguide, various methods such as (1) repetition of troublesome crystal growth, (2) change in composition of the active layer by selective growth, etc., (3) change in width of the optical waveguide, (4) change in periodicity of the diffraction grating on the semiconductor, etc. must be executed. However, if the optical waveguide is formed of the transparent electrode, respective layers can be formed of common semiconductor and therefore the effective refractive index can be changed only by the refractive index of the transparent electrode. Such change in the effective refractive index of the transparent electrode can be implemented by using the method being illustrated in the above embodiments in the case of the single device. For instance, the oscillating wavelengths can be changed by changing a width of the ITO layer 28, which is employed as the first layer in the third embodiment and has the high refractive index, device by device. In the seventh embodiment, as shown in FIG. 13, widths of the ITO layers 28-1 to 28-4 are changed every device. In addition to the above, there is the method of repeating the patterning and the etching such that a thickness of the ITO layer 28 in the second or third embodiment can be changed every device.

As in the seventh embodiment, the method of changing the width of the ITO layer 28 makes manufacture ready since the ITO layer 28 can be formed by one patterning process. Moreover, such method has an advantage that, since difference in the refractive indices between the ITO layers 28 and 29, the adjusting range of the wavelength can be widened.

As its application, the device may be constructed such that change in the refractive index provides effective phase shifts to uniform periodical structure. This does not correspond to the change in the refractive index in every device, but corresponds to the change in the refractive index along the resonator direction of the device. If the diffraction grating is uniform, the effective phase shift can be achieved in such changed area by changing the effective refractive index of the optical waveguide in the resonator. This is because the same effect as the phase shift of the diffraction grating can be produced since the guided wavelength in such areas is changed. This can be realized relatively simply. In other words, the width of the ITO layer 28 as the first layer may be changed in the resonator. For example, as shown in FIG. 9, a center portion 32 of the ITO layer 28 may be extended.

Embodiment 8

Figure 14:
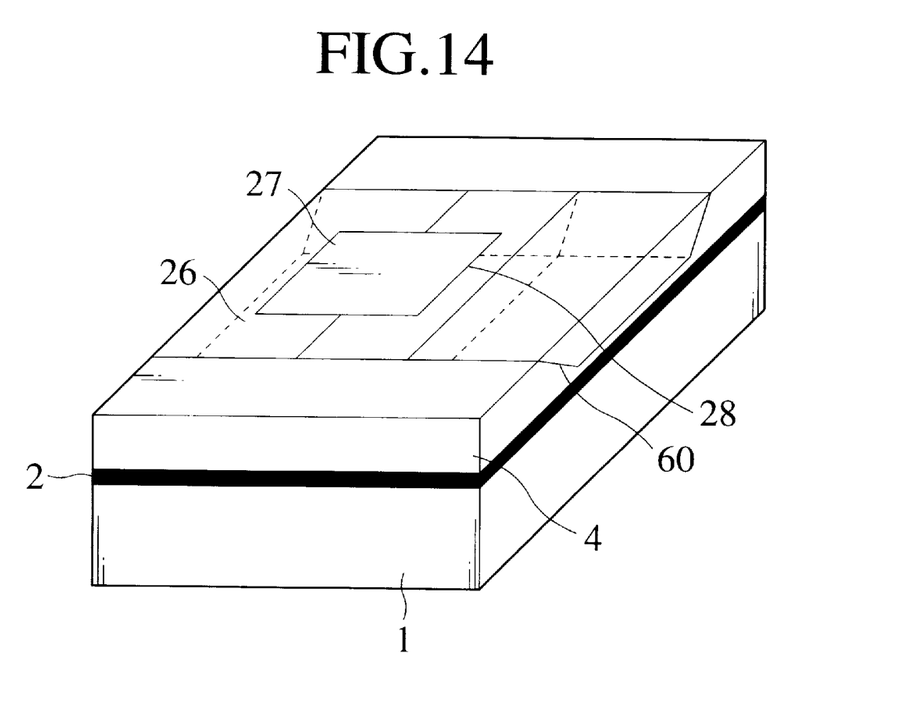
FIG. 14 is a schematic perspective view showing a structure of a laser diode according to an eighth embodiment of the present invention.

FIG. 14 is a schematic perspective view showing a structure of a laser diode according to an eighth embodiment of the present invention.

Normally the cleavage facets are needed in the laser diode of the type in which the output is emitted from the end facets. However, if the above embodiments are applied to the laser diode, the optical waveguide is superposed with the transparent electrode. The transparent electrode has no cleavage unlike the underlying semiconductor layers, so that smooth end surface can seldom be obtained to thus make it difficult to obtain good output field.

In the eighth embodiment, an example is given wherein the cleavage end facets can be obtained by making the semiconductor cladding layer thick and removing the transparent electrode near both ends of the resonator.

In FIG. 14, the semiconductor layers (preferably 1.0 $\mu$m to 2.0 $\mu$m, and more preferably 1.0 $\mu$m to 1.5 $\mu$m in thickness) in which the p-InP layer 4 is grown thick in advance is dug up to be 0.3 to 0.5 $\mu$m thick by etching other than the end areas. Then, stripe-shaped the ITO layer 28 and the SiO2 film 26 on either side of ITO stripe 28 are formed on an entire surface covering the etched depth of the concave portion. The ITO layer 28 can be formed by providing a taper portion 60 being formed for step-recoverage. at this time without breakdown on the step. The ITO layer 28 and the SiO2 film 26 near the end surface are removed later. If the end surface is formed by dry etching, or in the case of surface radiation type device such as the GCSEL, the above structure is not needed.

In the present invention, material of the transparent electrode constituting the optical waveguide is not limited to ITO in the above embodiments, and other material may be employed if it may function equivalently. For example, there are SnO2, polysilicon, etc.

In addition to the above-described embodiments, the present invention is applicable variously. For example, the present invention is applied to various optical waveguides formed of LiNbO3. The waveguide must be formed by diffusing Ti in the related art, but the electrode can be employed as the waveguide as it is in the present invention. Also, characteristics of the Ti diffused waveguide can be improved. In other words, the present invention is not limited to the device proposed in the embodiments and may be applied to various optical waveguides.

As described above, in the present invention, since the electrode structure and the optical waveguide mechanism are formed in common, the device can be simplified in configuration rather than the device structure in the related art. Accordingly, since the number of manufacturing steps can be reduced, especially steps of troublesome complicated epitaxial crystal growth, etc. can be reduced, yield of the device can be improved and thus cost of the device can be reduced.

Although the characteristics are defined only by the respective physical properties of the crystal and the metal in the related art, margin in design of the optical waveguide and the electrode can be enhanced if the transparent electrode and the optical waveguide are formed in common like the present invention, so that improvement in the characteristics can be achieved further.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. An optoelectronic device comprising:
   an optical waveguide structure having at least one optical waveguide;
   wherein the optical waveguide structure is formed of transparent electrode, and the transparent electrode is formed directly on an optical waveguide structure having a diffraction grating, and has partly a function of an optical waveguide.

2. An optoelectronic device comprising:
   an optical waveguide structure having at least one optical waveguide;
   wherein the optical waveguide structure is formed of transparent electrode, and the transparent electrode has a distribution of refractive index, waveguide loss, or conductivity therein.

3. An optoelectronic device as claimed in claim 2, wherein the distribution of refractive index, waveguide loss, or conductivity in the transparent electrode is implemented by a multi-layered structure in which each layer has different refractive index, waveguide loss, or conductivity.

4. An optoelectronic device as claimed in claim 2, wherein the distribution of refractive index, waveguide loss, or conductivity in the transparent electrode has periodicity along a waveguide direction of the optical waveguide.

5. An optoelectronic device as claimed in claim 4, wherein the transparent electrode has a single layer structure, or a multi-layered structure in which each layer has different refractive index, waveguide loss, or conductivity, and
   the distribution of refractive index, waveguide loss, or conductivity is implemented by changing shapes of respective layers including-their thickness along an axial direction.

6. An optoelectronic device comprising:
   an optical waveguide structure having at least one optical waveguide;
   wherein the optical waveguide structure is formed of transparent electrode having a distribution of refractive index, and the distribution of refractive index in the transparent electrode is set larger in a center axis area of the optical waveguide in section than other areas of the optical waveguide.

7. An optoelectronic device comprising:
an optical waveguide structure having at least one optical waveguide;
wherein the optical waveguide structure is formed of transparent electrode, and a transverse sectional shape of the transparent electrode is a semi-circle or a semiellipse.

8. An optoelectronic device as claimed in claim 2, wherein the distribution of refractive index, waveguide loss, or conductivity in the transparent electrode or periodicity of the diffraction grating is set to produce Bragg scattering of second order or more relative to a waveguide light.

9. An optoelectronic device as claimed in claim 1, wherein refractive index of the transparent electrode is set smaller than an underlying optical waveguide.

10. An optoelectronic device as claimed in 1, wherein the transparent electrode is isolated electrically by insulating dielectric substance which has refractive index being substantially identical to the transparent electrode.

11. An optoelectronic device as claimed in claim 10, further comprising a mechanism for driving independently an optoelectronic device formed under a plurality of transparent electrode which are separated electrically by the insulating dielectric substance.

12. An optoelectronic device as claimed in claim 1, further comprising dielectric substance or semiconductor which has refractive index, optical loss, or gain being different from the transparent electrode, under the transparent electrode.

13. An optoelectronic device comprising:
an optical waveguide structure having at least one optical waveguide formed of transparent electrode; and
dielectric substance or semiconductor which has refractive index, optical loss, or gain being different from the transparent electrode, under the transparent electrode, and the dielectric substance or the semiconductor are aligned periodically along a direction of the optical waveguide.

14. An optoelectronic device comprising:
an optical waveguide structure having at least one optical waveguide;
wherein the optical waveguide structure is formed of transparent electrode, and the transparent electrodes are formed of ITO (Indium Tin Oxide).

15. An optoelectronic device as claimed in claim 14, wherein refractive index of the ITO is controlled by an amount of oxygen contained in the ITO.

16. An optoelectronic device as claimed in claim 14, wherein conductivity and insulating characteristic of the ITO is controlled by composition of tin contained in the ITO.

17. An optoelectronic device comprising:
an optical waveguide structure having at least one optical waveguide;
wherein the optical waveguide structure is formed of transparent electrode, and material under the transparent electrode is formed of same material as an upper cladding layer or an optical waveguide layer of a laser diode.

18. As optoelectronic device comprising:
an optical waveguide structure having at least one optical waveguide;
wherein the optical waveguide structure is formed of transparent electrode, and refractive index or thickness of the optical waveguide portion under the transparent electrode is set differently along an axis direction of the optical waveguide.

19. An optoelectronic device comprising:
an optical waveguide structure having at least one optical waveguide formed of transparent electrode; and
an impurity layer or a metal layer between the transparent electrode and underlying waveguide material to provide ohmic contact between them.

20. An optoelectronic device as claimed in claim 19, wherein a shape of the impurity layer or the metal layer between the transparent electrode and the underlying waveguide material is formed differently along an axis direction or a transverse direction.

21. An optoelectronic device as claimed in claim 8, wherein an area of the transparent electrode except for a window area from which an optical output is emitted is covered with an opaque electrode.

22. An optoelectronic device as claimed in claim 2, wherein change in optical properties is controlled to give a phase shift effect to the periodical optical structure.

23. An optoelectronic device comprising:
an optical waveguide structure having at least one optical waveguide;
wherein the optical waveguide structure is partly formed of transparent electrode, and
optoelectronic devices are integrated monolithically on a same substrate, and optical properties of the transparent electrodes of respective optoelectronic devices are different from device to device.

24. An optoelectronic device comprising:
an optical waveguide structure having at least one optical waveguide;
wherein the optical waveguide structure is partly formed of transparent electrode,
optoelectronic devices are integrated monolithically on a same substrate, and are formed as distributed feedback type or distributed Bragg reflector type devices each of which has an optical periodical structure along the optical waveguide, and
the optoelectronic devices oscillate outputs at different wavelengths by varying refractive indices of transparent electrodes of the optoelectronic devices respectively.

25. A laser diode device comprising:
an optical waveguide structure having at least one optical waveguide;
wherein the optical waveguide structure is partly formed of transparent electrode, and
the transparent electrode do not have a function of the optical waveguide near at least one cleaved end facet of the laser diode, but only semiconductor has the function of the optical waveguide near the at least one cleaved end surface,
otherwise both the transparent electrode and the semiconductor do not have the optical waveguide function at all near the at least one cleaved end facet of the laser diode.

* * * * *